United States Patent [19]

Shintaku et al.

[11] Patent Number: 5,132,506
[45] Date of Patent: Jul. 21, 1992

[54] VACUUM EVAPORATION APPARATUS AND METHOD FOR MAKING VACUUM EVAPORATED SHEET

[75] Inventors: Hidenobu Shintaku; Isamu Inoue; Ryutarou Akutagawa, all of Neyagawa; Shigeo Suzuki, Hirakata; Hirozo Takegawa, Sakai; Kayoko Kodama, Osaka, all of Japan

[73] Assignee: Matsushita Electric Industrial Co., Ltd., Kadoma, Japan

[21] Appl. No.: 618,310

[22] Filed: Nov. 28, 1990

[30] Foreign Application Priority Data

Nov. 29, 1989 [JP] Japan .......................... 1-309681
Jul. 9, 1990 [JP] Japan .......................... 2-180806

[51] Int. Cl.⁵ .............................................. B23K 15/00
[52] U.S. Cl. ................................ 219/121.15; 118/719; 219/121.16
[58] Field of Search ................... 219/121.15, 121.16, 219/121.17; 373/11, 16, 17; 118/719

[56] References Cited

U.S. PATENT DOCUMENTS

| | | | |
|---|---|---|---|
| 3,432,335 | 3/1969 | Schiller et al. | 219/121.12 X |
| 3,467,058 | 9/1969 | Box et al. | 219/121.11 X |

FOREIGN PATENT DOCUMENTS

| | | |
|---|---|---|
| 1508531 | 10/1969 | Fed. Rep. of Germany . |
| 1527305 | 4/1968 | France . |
| 58-185030 | 10/1983 | Japan . |

Primary Examiner—C. L. Albritton
Attorney, Agent, or Firm—Cushman, Darby & Cushman

[57] ABSTRACT

A vacuum evaporation apparatus has a melting pot containing evaporating material therein and a movable partition. A surface of the evaporating material is separated into a supplying surface (whereinto a Cr-Co material rod of replenishing material is supplied) and an evaporating surface (whereonto an electron beam is irradiated) by the partition only during deposition of evaporating material onto a substrate. After finish of the deposition, the partition is lifted and is apart from the surface.

9 Claims, 17 Drawing Sheets

State a

State b

State c

State d

VACUUM EVAPORATION APPARATUS AND METHOD FOR MAKING VACUUM EVAPORATED SHEET

FIELD OF THE INVENTION AND RELATED ART STATEMENT

1. Field of the Invention

The present invention relates to a vacuum evaporation apparatus for making vacuum evaporated sheet having a thin film of alloy on a substate and for use, for instance, as magnetic recording medium.

2. Description of the Related Art

A vacumm evaporation is widely used in making a functional film which is a material of a capacitor or a material of a magnetic recording tape, to form a thin film on a long tape or a film. It is necessary to produuce a large quantity of vapor for a long time during the vacuum evaporation. Therefore, it is required to replenish an evaporating material continuously into a melting pot of a heating apparatus.

In case the evaporating material is made of a single metal, it is enough to supply the material to be evaporated (e.g. metal) in a manner that amount of the evaporated material is supplemented. However, some evaporating material is composed of plural components having different evaporation rate. For example, Co-Cr alloy, which is a material of magnetic thin film, is widely used as an evaporating material. In such case, it is necessary to satisfy the following condition for replenishment of the material in order to keep a constant thickness and a constant composition of components of the alloy thin film formed on the substrate. The condition for replenishment of material is expressed by the following equation (1):

$$Y = \frac{1}{k} M, \tag{1}$$

wherein
M: Cr content in an objective alloy thin film,
Y: Cr content in the evaporating material in the heating apparatus (Usually the melted evaporating material is called "molten metal"), $$k = \frac{\text{evaporation rate of Cr}}{\text{evaporation rate of Co}}.$$

Usually, value of K is from 3 to 4. That is, Cr has a larger vapor pressure than that of Co. In case the equation (1) is satisfied, vapor produced from the surface of the evaporating material has the same amount of Cr content as M, since Cr included in the evaporating material is evaporated more rapidly than Co. Therefore, it is necessary to supply the material having Cr-content M in the same amount as that lost by the evaporation so as to keep constant the volume and the Cr content Y of the evaporating material in the melting pot. Thereby, it becomes possible to continuously deposit a thin film containing Cr at the content of M.

It is important that the material which is intended to be supplied should have a larger amount (composition) of a component (e.g. Cr) having a high evaporation rate than the amount in the evaporating material.

It has conventionally been known that in case the above-mentioned alloy material which consists of components having different evaporation rate is deposited, problems occur. Now, taking an example of Co-Cr alloy, the problems are explained in reference to FIGS. 22, 23 and 24. FIG. 22 is a sectional side elevation view of a first conventional vacuum evaporation apparatus.

Usually vacuum deposition is made in a vaccum, so a vacuum evaporation apparatus is disposed in a vacuum chamber (not shown in FIGS.). An evaporating material 1 which is made of Co-Cr alloy Cr content of e.g. Y is contained in a melting pot 2. Since the evaporating material 1 is the Co-Cr alloy which is a metal having high melting point, the melting pot 2 is a ceramic e.g. MgO as a heat resisting material. A hearth 40 firmly supports the melting pot 2 to prevent the evaporating material 2 from flowing out therefrom even in case the melting pot 2 made of a ceramic is broken by thermal shock, etc. The hearth 40 is uaually made of Cu. In the hearth 40, water-passage 41 are cut through for cooling the hearth 40 by flow of cooling water therein so that the hearth 40 does not melt. A case 42 which is usually made of Cu and has a thin thickness, is disposed between the hearth 40 and the melting pot 2. And the case 42 supports the melting pot 2 thereon. The case 42 has guard part 44 whereon some screw holes 43 are thread. In case the melting pot 2 with the case 42 is intended to be taken off, suitable bolts (not shown in FIGS.) are screwed in the screw holes 43 and by which the case 42 can be handled with ease.

The evaporating material 1 is heated to melt by an electron beam 7A which scans repeatedly in a direction shown by an arrow E. The electron beam 7A is bent by magnetic flux generated by a magnet (not shown in FIGS.) so as to reach the surface 4. A Cr-Co material rod 3 of replenishing material made of a Co-Cr alloy having Cr content of e.g. M is provided to touch the surface 4 of the evaporating material 1. The Cr-Co material rod 3 is pushed out from a case 15 at a given speed by rotation of a moving roller 14 and supporting rollers 11, 12 and 13. The moving roller 14 is driven by a motor (which is not shown in FIGS.). The motor can be disposed either inside the vacuum chamber (not shown in FIGS.) or outside the chamber, and drives the moving roller 14 through a conventional transformer (not shown in FIGS.) e.g. a gear box. Thus, the Cr-Co material rod 3 moves at a constant speed toward a surface 4 of evaporating material 1 in melting as indicated by an arrow A. The cover 15 prevents the rollers 11, 12, 13 and 14 from undesirable deposition due to vapor of evaporating material 1. A substrate 8 e.g. a plastic film to be coated by evaporation is transferred above the melting pot by a known rollers (not shown in FIGS.) or the like which are used for transferring and supporting.

By the above-mentioned apparatus, the Cr-Co material rod is drawn out in order to replenish the amount which are lost owing to evaporation of the evaporating material 1 in the melting pot 2, so that thin film 9 having a constant thickness and a constant proportion of components can be produced for a long time.

FIG. 23 is an enlarged detailed view of the surface 4E shown in FIG. 22. When a lower end tip 5 of the rot 3 touches the surface 4, it begins to melt on the evaporating material 1 and converts into molten metal 6 by absorbing heat of the latter, and the molten metal 6 is mixed into the evaporating material 1 in molten metal state. Then, a part 6A of the molten metal 6 flows onto an evaporating surface 4E in an evaporating area Ea which is heated more higher than the other area by irradiation of the electron beam 7A. The molten metal 6 includes very large amount (i.e. M) of Cr having the high evaporation rate than that (i.e. Y) of the evaporating material 1, and hence a rapid evaporation is made. The rapid evaporation results in undesirable scatter of drops of the molten metal.

The scatter of drops of the molten metal is also produced by a below-mentioned cause. In some cases, impurity e.g. oxide is attached on the surface of the Cr-Co material rod 3 and whereon oxidized layer is usually formed, to the Cr-Co material rod 3 contains impurity e.g. oxide which is mixed therewith in its production process.

FIG. 24 is an enlarged detail view of the surface 4E of the evaporating material whereon floaters 3A are provided. When the Cr-Co material rod 3 having impurity as mentioned above touches the surface of the evaporating material 1 as shown in FIG. 24, the oxide floats on the evaporating material 1 as the floaters 3A, since the above-mentioned oxide having higher melting point and lower specific density than the evaporating material 1. When the floater 3A flows on the evaporating surface 4E and is irradiated by the electron beam 7A, the floater 3A is heated to a high temperature owing to its higher melting point. Then rapid evaporation, which is similar to the above-mentioned one, is made by the impurity at the contacting surface of the evaporating material 1 with the heated up floater 3A and results undesirable scatter of drops of the molten metal.

The drops are called "splash", which adheres on the substrate surface and results undesirable protruded foreign matter (part) thereon. The protruded foreign matter on the substrate of magnetic recording medium leads an obstacle to normal recording and reproducing. The protruded foreign matter makes problem owing to large gap between a magnetic head and the magnetic recording medium.

A second conventional vacuum evaporation apparatus which copes with the great problem is shown in FIG. 25. FIG. 25 is a sectional side elevation view of the second conventional vacuum evaporation apparatus. Corresponding parts and components to the first conventional vacuum evaporation apparatus are shown by the same numerals and marks, and the description thereon made in the first conventional vacuum evaporation apparatus similarly apply. Differences and features of this second conventional vacumm evaporation apparatus from the first conventional vacuum evaporation apparatus are as follows. A partition 25 is disposed between the evaporating surface Ea and a supplying surface 4S in a supplying area Sa and is fixed with the melting pot 2.

In case the evaporating material 1 is a metal having high melting point such as a Co-Cr alloy, the partition 25 is a ceramic e.g. MgO similarly to the melting pot 2.

Owing to the above-mentioned constitution, the molten metal 6 of the Cr-Co material rod 3 does not directly flow onto the evaporating surface 4E in the evaporating area Ea but diffuses into underneath of the evaporating surface 4E from the supplying surface 4S through a gap C between the partition 25 and the bottom of the melting pot 2. Therefore, Cr contents of the molten metal 6 is diluted with evaporating material 1. Therefore the molten metal 6 having diluted Cr contents reaches the evaporating surface 4E, so that the rapid evaporation due to the larger amount of Cr is never produced. Further, since the above-mentioned floaters 3a cannot flow onto the evaporating surface 4E by damming (interrupting) of the partition 25, the rapid evaporation due to the impurity is never produced too. Thus occurrence of splash is prevented.

The above-mentioned second conventional vacuum evaporation apparatus has the following two problems:

A first problem is that, when an ingot (which is usually shaped in a Cr-Co material rod or a cube) of the evaporating material in the melting pot 2 is intended to be melt by irradiation of the electron beam 7A before evaporation, molten metal melted from the ingot touches the partition 25 and makes the partition 25 crack by a thermal shock.

A second problem is that when the irradiation of electron beam 7A is stopped after evaporation, the molten metal of evaporating material 1 begins to solidify and the partition 25 is broken by a force owing to the solidification.

The first problem can be coped with by disposing a heater in the partition 25 for pre-heating therefor, which results a complicated constitution. But the second problem is difficult to cope with.

OBJECT AND SUMMARY OF THE INVENTION

The object of the present invention is to provide a vacuum evaporation apparatus which enables to prevent the splash and to produce magnetic recording medium having a little protruded foreign matter made at low cost with high productive efficiency by utilizing the vacuum evaporation apparatus.

These and other objects are accomplished by a vacuum evaporation apparatus which comprises:

a melting pot for containing evaporating material therein, an electron gun which irradiates an electron beam onto the evaporating material, a replenishing material which is supplied into a surface of the evaporating material by a supplying means for replenishing the evaporating material, and a movable partition which is moved by moving means in a manner that the partition has a first position wherein the partition separates the surface into a supplying surface and an evaporating surface and a second position wherein said partition is removed apart from the surface.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

With reference to the accompanying drawings.

It will be recognized that some or all of the Figures are schematic representations for purposes of illustration and do not necessarily depict the actual relative sizes or locations of the elements shown.

DESCRIPTION OF THE PREFERRED EMBODIMENT

Figure 1:
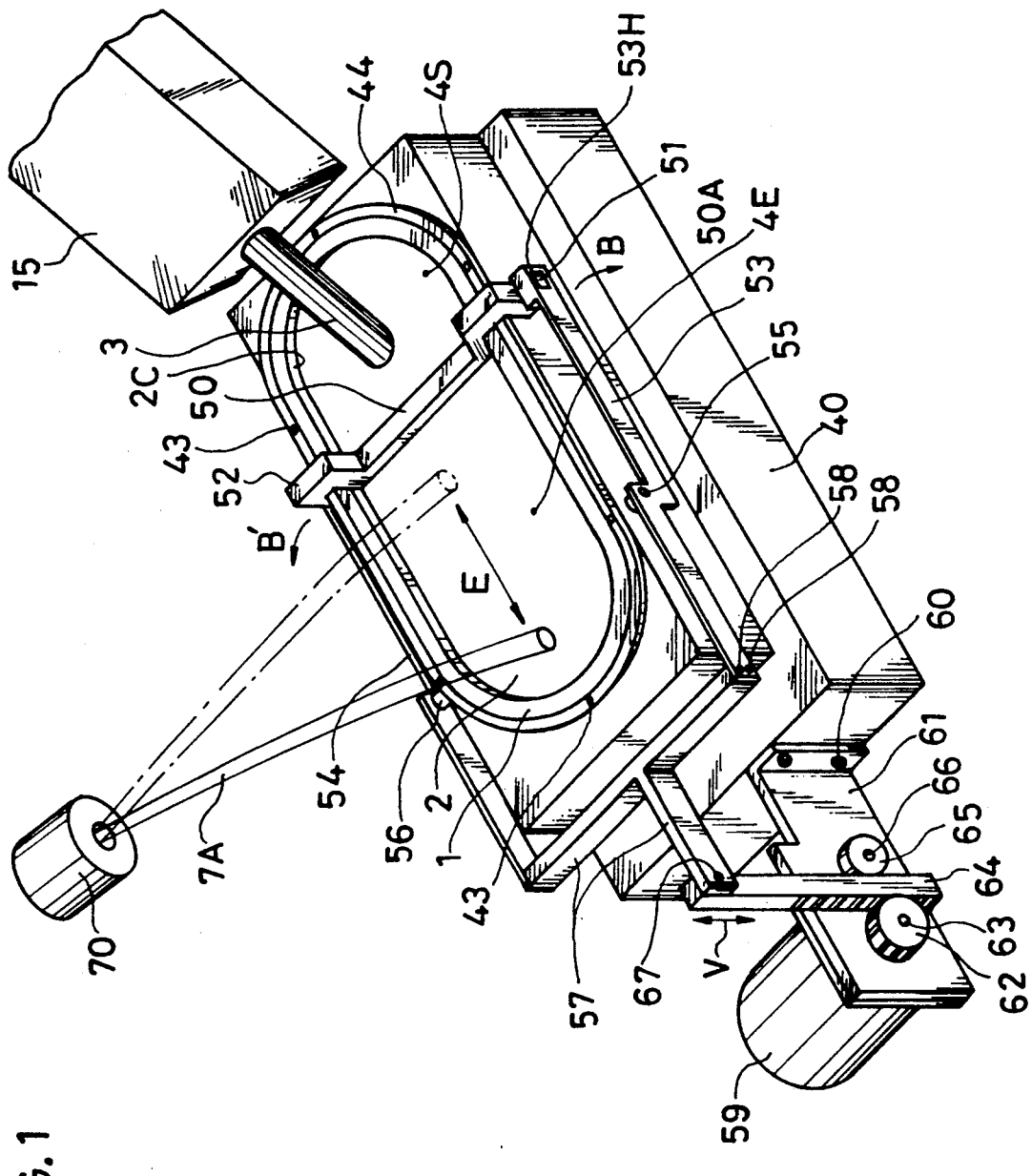
FIG. 1 is a perspective view of a vacuum evaporation apparatus of a first embodiment of the present invention.
Figure 2:
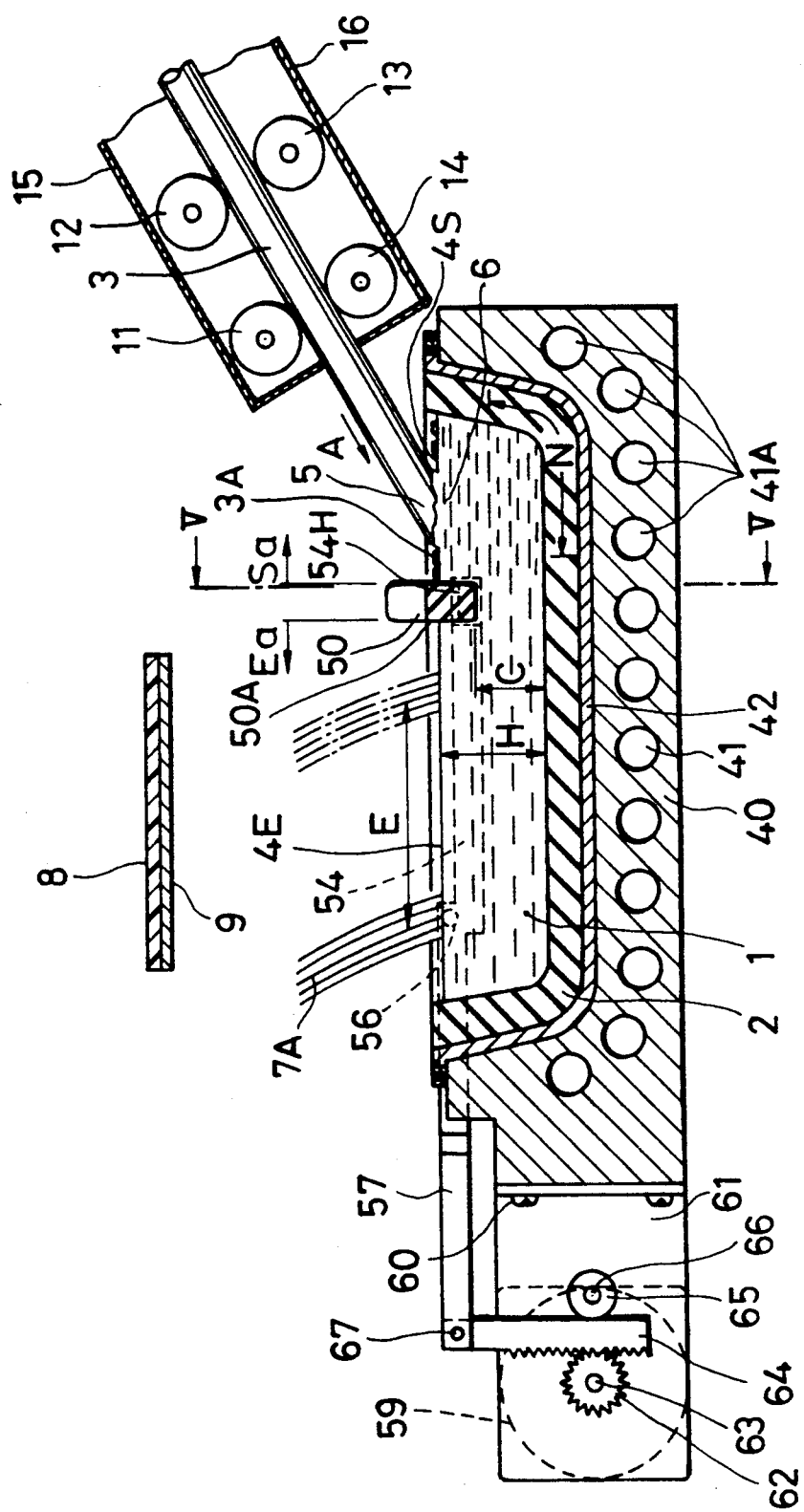
FIG. 2 is a sectional side elevation view of the vacuum evaporation apparatus shown in FIG. 1.

Hereafter, a first embodiment of the present invention is elucidated with reference to the accompanying drawings. FIG. 1 is a perspective view of a vacuum evaporation apparatus of a first embodiment of the present invention. FIG. 2 is a sectional side elevation view of the vacuum evaporation apparatus shown in FIG. 1.

Usually, vacuum deposition is made in a vacuum, so a vacuum evaporation apparatus is disposed in a vacuum chamber (not shown in FIGS.). An evaporating material 1 which is made of Co-Cr alloy having Cr content of e.g. Y is contained in a melting pot 2. Since the evaporating material 1 is the Co-Cr alloy which is a metal having high melting point, the melting pot 2 is a ceramic made of e.g. MgO as a heat resisting material.

A hearth 40 firmly supports the melting pot 2 to prevent evaporating material 2 from flowing out therefrom even in case the melting pot 2 made of ceramic is broken by e.g. a thermal shock etc. The hearth 40 is usually made of Cu.

In the hearth 40, water-passages 41 are cut through for cooling the hearth 40 by flow of cooling water therein so that the hearth 40 doles not melt. A case 42 which is usually made of Cu and has thin thickness, is disposed between the hearth 40 and the melting pot 2. And the case 42 supports the melting pot 2 thereon. The case 42 has guard part 44 whereon some screw holes 43 are thread. In case the melting pot 2 with the case 42 is intended to be taken off, suitable bolts (not shown in FIGs) are screwed in the screw holes 43 and by which the case 42 can be handled with ease.

An electron gun 70 which irradiates an electron beam 7A is disposed nearby the melting pot 2. The electron gun 70 has a conventional deflecting system which scans the electron beam 7A. The electron beam 7A is bent by magnetic flux generated by a magnet (not shown in FIG.s) so as to reach the surface 4. The evaporating material 1 is heated to melt by the electron beam 7A which scans repeatedly in a direction shown by an arrow E. A Cr-Co material rod 3 of replenishing material made of a Co-Cr alloy having Cr content of e.g. M is provided to touch the surface 4 of the evaporating material 1. The Cr-Co material rod 3 is pushed out from a case 15 at a given speed by rotation of a moving roller 14 and supporting rollers 11, 12 and 13. The moving roller 14 is driven by a motor (which is not shown in FIGs.). The motor can be disposed either inside the vacuum chamber (not shown in FIGs.) or outside the chamber, and drives the moving roller 14 through a conventional transformer (not shown in FIGs.) e.g. a gear box. Thus, the Cr-Co material rod 3 moves at a constant speed toward a surface 4 of the evaporating material 1 in melting as indicated by an arrow A. The constant speed is a supplying speed Vs of the Cr-Co material rod. The cover 15 prevent the rollers 11, 12, 13 and 14 from undesirable deposition due to vapor of evaporating material 1. A substrate 8 e.g. a plastic film to be coated by evaporation is transferred above the melting pot 2 by a known rollers (not shown in FIGs.) or the like which are used for transferring and supporting.

By the above-mentioned apparatus, the Cr-Co material rod 3 is drawn out in order to replenish the amount which are lost owing to evaporation of the evaporating material 1 in the melting pot 2, so that thin film 9 having a constant thickness and a constant proportion of components can be produced for a long time.

A partition 50 which is made of a ceramic e.g. MgO and has both side parts 51 and 52 are provided on the surface 4 of the evaporating material 1. The side engaging parts 51 and 52 of the partition 50 are inserted respectively in rectangular holes 53H and 54H formed in the end part of levers 53 and 54. The levers 53 and 54 supports the partition 50. The levers 53 and 54 are made of a metal e.g. stainless steel, and hence the levers 53 and 54 can be bent toward outward directions shown by arrows B and B', for insertions of the parts 51 and 52.

Pivots 55 and 56 are disposed on the hearth 40, and supports levers 53 and 54 pivotally. A lever 57 shaped like a letter "T" is fixed with the levers 53 and 54 by screws 58, 58, 58, 58. The lever 57 is pivotally connected to a rack 64 with a pivot 67. The rack 64 is engaged with a pinion 62 which is fixed to a shaft of a motor 59. The motor 59 is fixed on a bracket 61, and a roller 65 is rotatably connected to a pivot 66 fixed on the bracket 61. By holding the rack 64 between the pinion 62 and the roller 65, rack-pinion engagement of the rack 62 with the pinion is kept. According to rotation of the motor 59, the rack 64 is moved up and down almost in a vertical line V which is shown by an arrow V.

Figure 3:
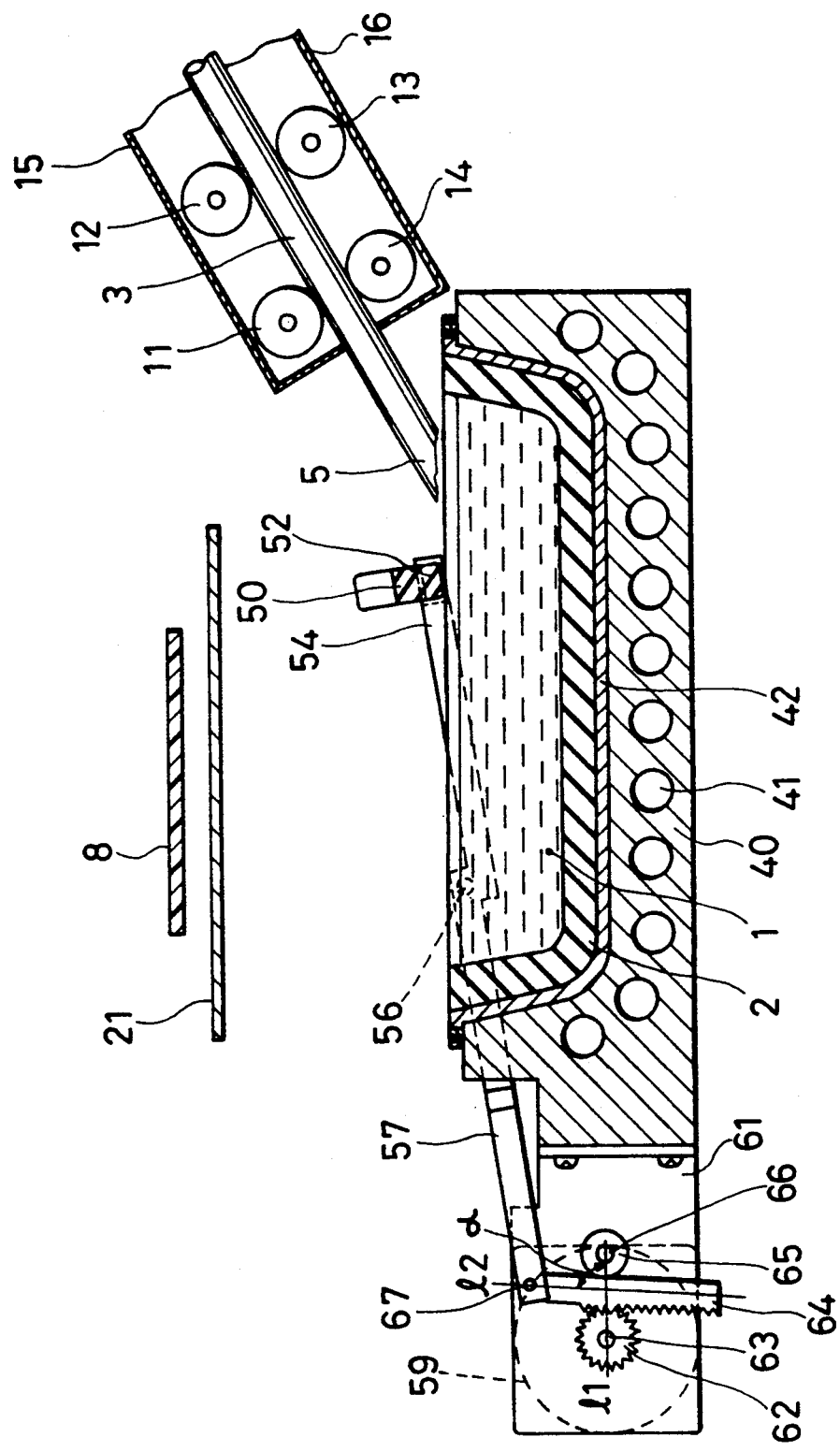
FIG. 3 is a sectional side elevation view of the vacuum evaporation apparatus of the first embodiment at an initial state.

Next, the operation of the levers 53 and 54 is elucidated. FIG. 3 is a sectional side elevation view of the vacuum evaporation apparatus of the first embodiment at an initial state.

As shown in FIG. 3, the rack 64 is moved down at a low position which is lower than the position shown in FIG. 2. Thereby, the lever 57 is turned round the pivots 56 and 57 and is located at a position which is turned counterclockwise from the position shown in FIG. 2. Thus, the partition 50 is lifted at a higher position than the position shown in FIG. 2.

In FIG. 3, an angle $a$ between a line l1 connecting the pivot 63 and the pivot 66 and an axial line l2 of the rack 64 becomes smaller than 90°, so the rack 64 may applies force to stretch the gap between the pivots 63 and 66. But such stretching force can be removed by suitably enlarging the interval between the pivots 63 and 66 than its theoretical valve. And thereby, the moving members of the rack 64, the pinion 62, the lever 57 and etc., can be moved easily without producing large stresses.

In this initial state, the end tip 5 of the Cr-Co material rod 3 is drawn back in the cover 15 in comparison with the position of the end tip 5 shown in FIG. 2. A known shutter 21 is disposed between the melting pot 2 and the substrate 8.

Figure 4:
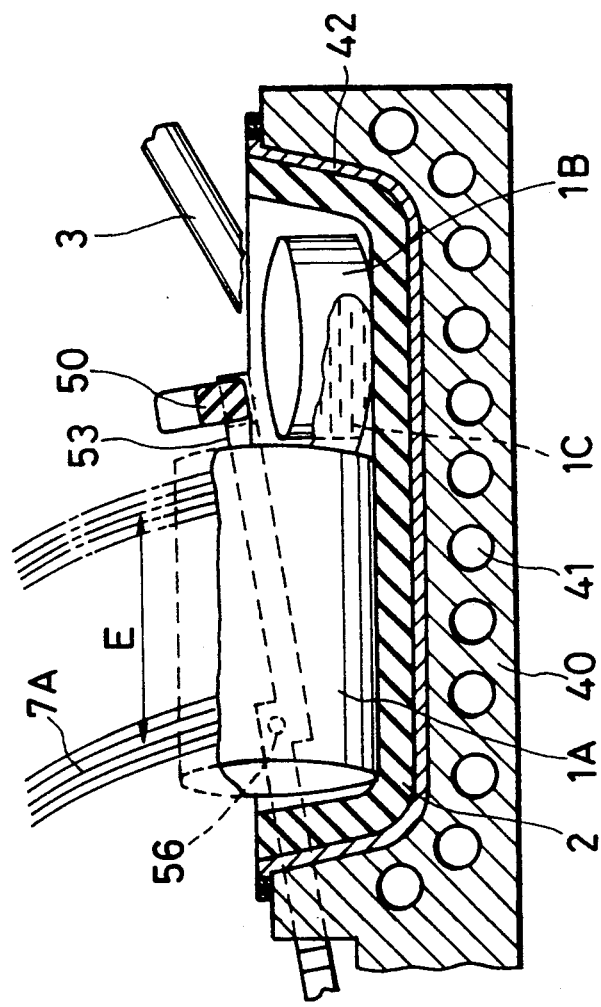
FIG. 4 is a sectional side elevation view of the vacuum evaporation apparatus of the first embodiment before melting the evaporating material therein.

FIG. 4 is a sectional side elevation view of the vacuum evaporation apparatus of the first embodiment before melting the evaporating material. In FIG. 4, the partition 50 and the Cr-Co material rod 3 are at the same position as shown in FIG. 3. Referring to FIG. 4, at first, a material 1A of e.g. Cr and a material 1B of e.g. Co of ingot are put in the melting pot 2 so as to be melt into the evaporating material 1. The electron beam 7A irradiates the material 1A in the melting pot 2, and the material 1A is melt into molten metal 1C. The molten metal 1C which comes from the material 1A touches the material 1B, which is not irradiated by the electron beam 7A, and fuses the material 1B by thermal conduction therefrom. Finally, both the materials 1A and 1B are melt together to form the evaporating material 1.

In the above-mentioned melting process of the evaporating material 1, since the partition 50 is apart from and over the surface 4 of the evaporating material 1, the partition 50 is never broken by thermal shock owing to touching with the molten metal 1C. Since the shutter 21 covers the substrate 8 against the melting pot 2 during the melting process, there is no undesirable forming of a film on the substrate 8 owing to vapor from the evaporating material 1 during the melting process.

Next, the pinion 62 is rotated in counterclockwise direction by the motor 59, so that the partition 50 is lowered onto the surface 4 through motion of the rack 64 and the lever 57. A descending speed $V_1$ of the partition 50 is kept so small that enough pre-heating of the partition 50 is made by radiant heat from the surface 4. From our some experiments, the descending speed $V_1$ is preferably smaller than e.g. 10 mm/min. By so limiting the descending speed $V_1$, the partition 50 is never broken by the thermal shock owing to touching the surface 4.

In the end, the partition 50 is lowered into the evaporating material 1 at a predetermined depth (which is determined from a gap C shown in FIG. 2) by rotation of the motor 59. After touching of the partition 50 to the surface 4, the partition 50 can be lowered at a descending speed $V_2$ which is faster than the descending speed $V_1$. And this faster descending speed $V_2$ shortens a period of preparation for deposition. Thereby, the partition 50 separates the surface 4 into a supplying surface 4S in a supplying area Sa and an evaporating surface 4E in an evaporating area Ea. Thus the supplying surface 4S is defined by a side wall 2C in the supplying area Sa of the melting pot 2 and the partition 50. The supplying surface 4S is the surface for receiving the replenishing material therein, and is isolated from the evaporating surface 4E.

Next, the Cr-Co material rod 3 is drawn out from the case 15 as shown by an arrow A in FIG. 2 by rotation of the roller 14 by driving the roller motor (not shown in FIGS.) for replenishment of the evaporating material 1. And deposition onto the substrate 8 is made by opening the shutter 21.

The partition 50 prevents the molten metal 6 of the Cr-Co material rod 3 from direct flowing to the evaporating surface 4S and prevents the floaters 3A from flowing to the evaporating surface 4E almost similarly to the afore-mentioned partition 25, and so occurrence of the undesirable splash can be stopped.

After finishing of the deposition, the pinion 62 is rotated in clockwise direction of FIG. 2 by the motor 59 to lift the partition 50 through motions of the rack 64 and the lever 57, so that the partition 50 is apart again from the surface 4 of the evaporating material 1 as shown in FIG. 3.

Figure 5:
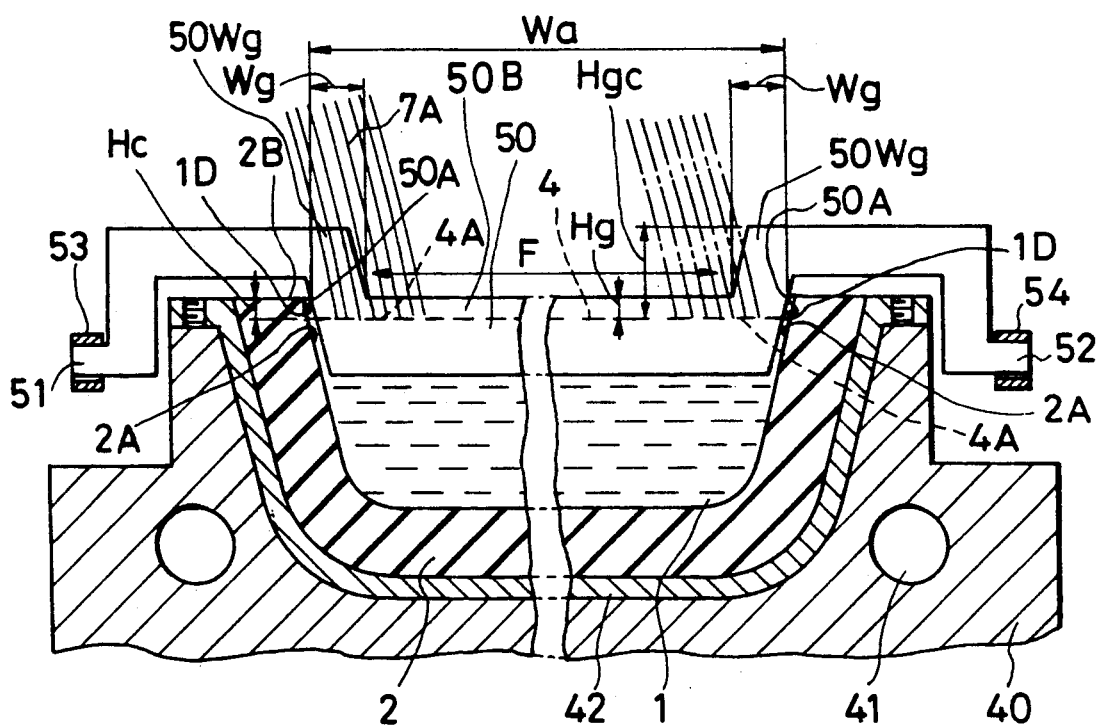
FIG. 5 is a sectional view taken along the line V—V of FIG. 2.

FIG. 5 is a sectional view taken along the line V—V of FIG. 2. As shown in FIG. 5, parts 50A,50A of the partition 50 are loosely coupled making narrow gaps 1D,1D thereto respective parts 2A,2A (which are above the surface 1) of the side wall of the melting pot 2. Some portion of vapor of the evaporating material 1 fly through the respective gaps 1D,1D. A portion of vapor flowing through the gaps 1D,1D is liquefied upon touching (grazing) the part 50A and/or the part 2A, when temperature there is not low, and at that time, the partition can be lifted up. And if a temperature of the part 2A and/or the part 50A is low, the vapor of the evaporating metal solidifies in the narrow gaps 1D,1D, and the partition 50 is caught by the part 2A. Thus it becomes difficult to lift the partition 50.

Figure 6:
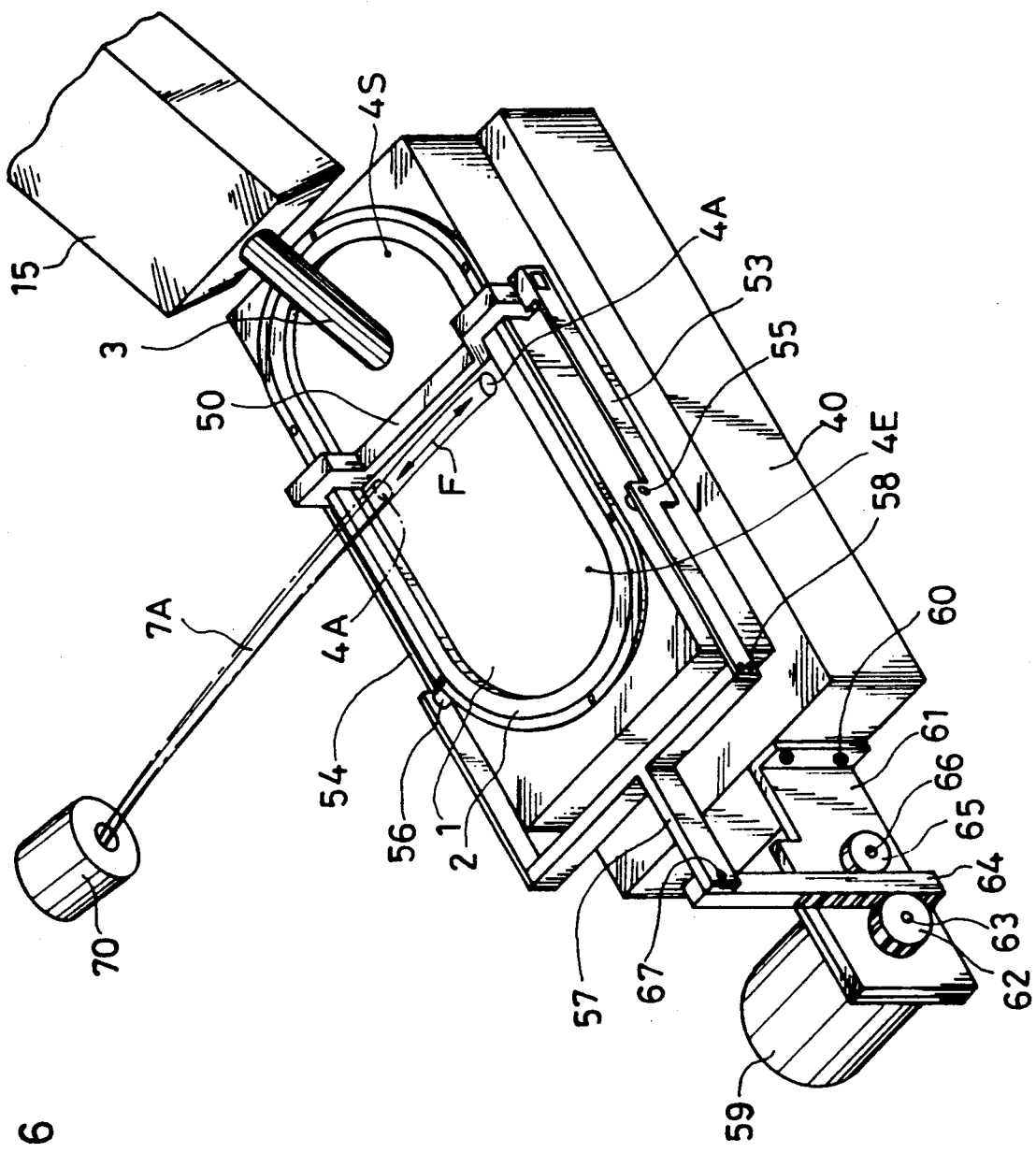
FIG. 6 is a perspective view of the vacuum evaporation apparatus of the first embodiment wherein the electron beam 7A is in "scanning after-heating"

In case the solidification happens, the electron beam 7A is made scan along the partition 50 as shown by an arrow F in FIG. 6, to heat areas 4A,4A of the surface 4 in the neighborhood of the gaps 1D,1D, and simultaneously the partition 50 is lifted (As a matter of convenience, hereinafter this scanning of the electron beam is referred to as "scanning after-heating"). FIG. 6 is a perspective view of the vacuum evaporation apparatus of the first embodiment wherein the electron beam 7A is in "scanning after-heating". Thus the solidified metal in the gaps 1D,1D is melt by heat (thermal conduction) from the areas 4A,4A and the partition 50 can be lifted.

By continuing the heating by the electron beam 7A until lifting of the partition 50 to apart from the surface 4, the partition 50 is never broken by solidification of the evaporating material 1. Thus the partition 50 is usable many times repeatedly.

Next, elucidation is made about the way of determining a gap C (shown in FIG. 2) between the partition 50 and the bottom of the melting pot 2. In case the gap C (shown in FIG. 2) is too narrow, thermal conduction from the evaporating area Ea to the supplying area Sa through the gap C becomes small. Thereby, the temperature in the supplying surface 4S is low and the Cr-Co material rod 3 is hardly melted. And finally, the end tip 5 of the Cr-Co material rod 3 pushes and breaks the partition 50.

On the contrary, in case the gap C is too wide, the Cr contents of the molten metal 6 of the rot 3 is not diluted enough before flowing into the evaporating surface 4E. So the effect of prevention of splash is reduced. In order to keep sufficient effect of prevention of splash, the following condition as to the gap C should be satisfied:

$$C/H < \frac{9}{10} \text{ or,} \quad (2)$$

more preferably $$C/H < \frac{4}{5}, \quad (3)$$

wherein H is a depth of the evaporating material 1 in the melting pot 2.

When the value of C/H is in the above-mentioned preferred range, in case the temperature of the supplying surface 4S is low and the Cr-Co material rod 3 is not melt enough, it is necessary to rise the temperature of the supplying surface 4S. It is desirable to dispense with or to reduce the section area of the water flow duct in the part of water-passage 41 only at the neighborhood of the supplying area Sa. Or alternatively, an adiabatic material e.g. asbestos may be provided only between the part of the melting pot 2 and the case 42 at the neighborhood of the supplying area Sa in order to raise the temperature of the supplying surface 4S. That is, the melting pot 2 should have more adiabatic condition only at the neighborhood (which is designated by an arrow N in FIG. 2) of the supplying area Sa than the other part thereof.

In case the melting point of the Cr-Co material rod 3 is low or the heat of fusion thereof is small, the end tip 5 of the Cr-Co material rod 3 is melted up quicker than the supplying speed Vs of the Cr-Co material rod 3. Hereinafter, movement of the end tip 5 is elucidated with reference to FIGS. 7, 8, 9 and 10.

Figure 7:
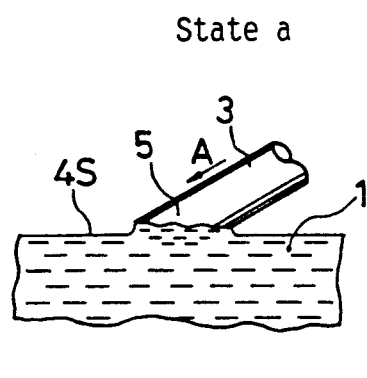
FIG. 7 is a side view showing the end tip 5 of the Cr-Co material rod 3 in touch with the surface 1 as "a first state a" when the end tip 5 touches the surface 1.
Figure 8:
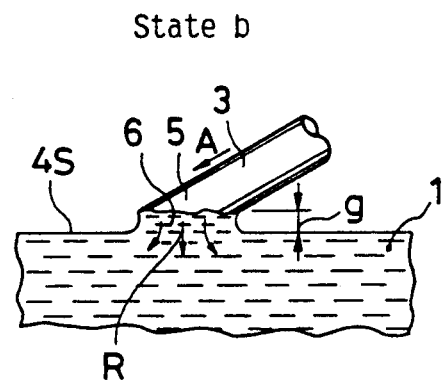
FIG. 8 is a side view showing the end tip 5 of the Cr-Co material rod 3 in touch with the surface 1 as "a second state b" subsequent to "the first state a"

FIG. 7 is a side view showing the end tip 5 of the Cr-Co material rod 3 which is in touch with the surface 1 as a state when the end tip 5 touches the surface 1. For the sake of convenience, hereinafter we refer to this state us "the first state a". At "the first state a", the end tip 5 begins to melt by absorbing heat from the supplying surface 4S, converting itself into the molten metal 6, which dissolves into the evaporating material 1 in liquid state as shown by an arrow R in FIG. 8. FIG. 8 is a side view showing the end tip 5 of the Cr-Co material rod 3 in touch with the surface 1 as "a second state b" which is a state subsequent to "the first state a". In FIG. 8, heat is conveyed toward the opposite direction of the arrow R to the end tip 5, thereby melting the end tip 5.

Figure 9:
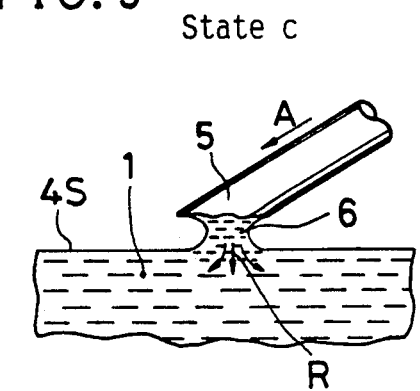
FIG. 9 is a side view showing the end tip 5 of the Cr-Co material rod 3 in touch with the surface 1 as "a third state c" subsequent to "the second state b"
Figure 10:
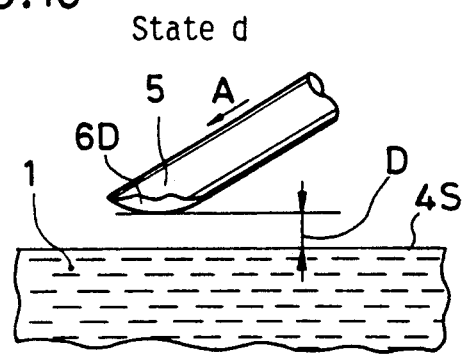
FIG. 10 is a side view showing the end tip 5 of the Cr-Co material rod 3 in touch with the surface 1 as "a fourth state d" subsequent to "the third state c"

As melting of the end tip 5 proceeds, the heat transfer from the molten metal 6 to the end tip 5 is reduced because of increase of distance g between the end tip 5 and the supplying surface 4S. Then the melting amount of the end tip 5 is reduced, which results in reduced amount of the molten metal 6 as shown in FIG. 9. FIG. 9 is a side view showing the end tip 5 of the Cr-Co material rod 3 touching the surface 1 as "a third state c", which is subsequent to "the second state b". At the third state c, it becomes more hard to melt the end tip 5 because of further increase of the distance g and simultaneous decreasing of the section of the part of molten metal 6. And in the end, melting of the end tip 5 is stopped as shown in FIG. 10. FIG. 10 is a side view showing the end tip 5 of the Cr-Co material rod 3 in touching the surface 4 as "a fourth state d" which is subsequent to "the third state c".

The melting process of the Cr-Co material rod 3 is successively shown through FIGS. 11, 12, 13 and 14.

During the melting process of from the state "a" to the state d, the Cr-Co material rod 3 moves at the supplying speed Vs toward the supplying surface 4S as shown by an arrow A. Generally, the supplying speed Vs is smaller than the melting speed of the end tip 5 shown FIG. 7 through FIG. 10, and it produces a gap 10 D as shown in FIG. 10. As the Cr-Co material rod 3 still moves at the supplying speed Vs, the gap D shown in FIG. 10, decreases. Finally, the end tip 5 touches the supplying surface 4S again as shown in FIG. 7. Thus the phenomena from "the first state a" to "the fourth state d" is repeated many times. Thereby the material of the Cr-Co material rod 3 is intermittently supplied to the surface 4 in spite of continuous moving of the Cr-Co material rod 3.

Figure 11:
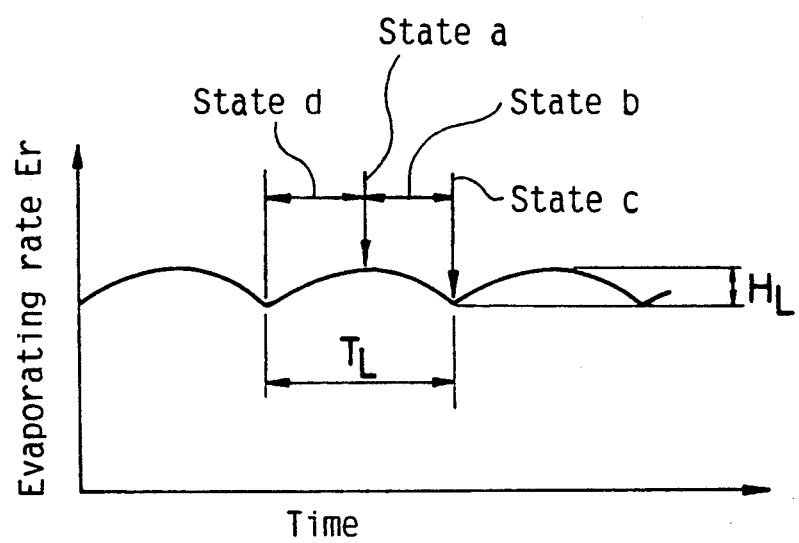
FIG. 11 is a time chart showing the time change of the evaporation rate Er.

During the melting of the end tip 5 is onto the supplying surface 4S, the heat is lost from the supplying surface 4S owing to the melting, and therefore the temperature in the supplying surface 4S lowers. The lowering of the temperature in the supplying surface 4S influences on the evaporating surface 4E in the evaporating area Ea through the gap C, and the temperature of the evaporating surface 4E is lowered. Thus evaporating temperature in the evaporating surface 4E lowers, and this leads to reduction of an evaporating rate Er of evaporating material 1. Thereby the evaporating rate Er changes periodically with a period $T_L$, which is from "the first state a" to "the fourth state d" as shown in FIG. 11. FIG. 11 is a time chart showing the time change of the evaporation rate Er. In FIG. 11, a level difference $H_L$ designates a change difference $H_L$ of the evaporating rate.

In FIG. 10, the thicker the Cr-Co material rod 3 is, the larger the gap D becomes. The reason is as follows. A shape of the molten metal 6 can be considered almost as a column or cylinder. The thicker the column is, the smaller a S/V ratio of "(a surface area of the column)/(a volume of the column) is". The smallness of the ratio S/V induces a ratio R/C of "(the heat quantity which is lost by radiation from the surface of the column)" against "(the heat quantity which conducts from the surface 4S to the end tip 5 through the molten metal 6)". The smallness of the ratio R/C results in making the column (i.e. the molten metal 6) lengthen. Thus, the thicker the Cr-Co material rod 3 is, the larger both the period $T_L$ and the change width $H_L$ become.

The molten metal 6 at the end tip of the Cr-Co material rod 3 having a larger content of Cr than the evaporating material 1 periodically dissolves in the supplying surface 4S, and induces and periodical concentration change of Cr therein. And this periodical concentration change of Cr in the supplying surface 4S gives an influence on the evaporating surface 4E through diffusion in the evaporating material 1 under the partition 50 (FIG. 1.). Thus the concentration of Cr in the vapor, which evaporates from the evaporating surface 4E, changes or fluctuates periodically in accordance with change of the evaporating rate Er as shown in FIG. 11.

The fluctuation or periodical change of the evaporating rate Er and the Cr-concentration in the vapor induces an undesirable problem of fluctuation in lengthwise direction of tape of Co-Cr proportion of the evaporation-deposited film 9 on a substrate tape 8, which is manufactured by the known running-tape evaporation-deposition process.

It is necessary to prevent the intermittent melting of the Cr-Co material rod 3 in order to avoid the above-mentioned problem. The temperature of the supplying surface 4S can be lowered to a suitable temperature by designing the apparatus in a manner to have a small ratio of C/H. Then, the supplying speed Vs becomes almost the same as the melting speed of the end tip 5. Thereby it is realized to supply the evaporating material from the Cr-Co material rod 3 continuously by keeping the state of connection of the end tip 5 with the supplying surface 4S as shown in FIG. 8. Thus the prevention of the intermittent melting is made.

Figure 12:
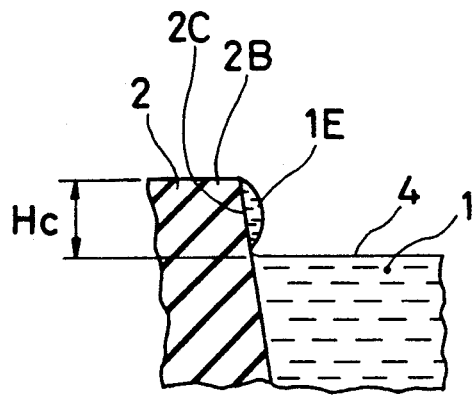
FIG. 12 is a fragmentary sectional view showing a small droplet 1E formed on an inner surface 2C.

Next, elucidation is made on a preferable height Hc from the surface 4 with reference to FIGS. 5, 12, 13, 14, 15 and 16. FIG. 12 is a fragmentary sectional view showing a small droplet 1E formed on an inner surface 2C. In FIG. 12, a part of vapor from the surface 4 condenses into a small droplet 1E on the inner surface 2C of the melting pot 2. When the temperature of the surface 2C is high, the small droplet 1E is liquid. On the contrary, when the temperature of the inner surface 2C is low, the small droplet 1E is solidified.

Figure 13:
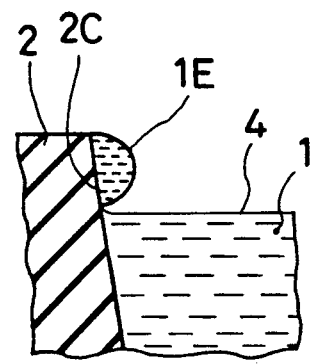
FIG. 13 is a fragmentary sectional view showing the droplet 1E which becomes large.
Figure 14:
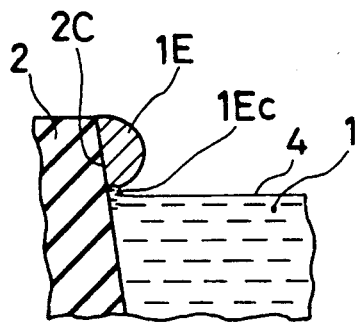
FIG. 14 is a fragmentary sectional view showing the solidified droplet 1E.
Figure 15:
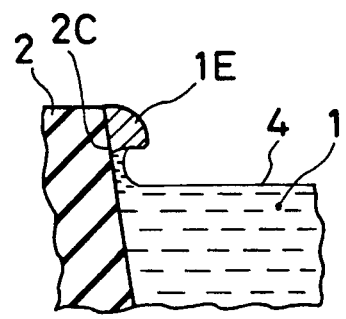
FIGS. 15 and 16 are fragmentary sectional views showing the solidified droplet 1E which is being melt in the surface 4 in the order of proceeding time.
Figure 16:
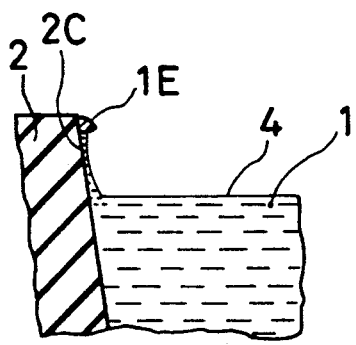

The droplet 1E becomes large as the time proceeds, as shown in FIG. 13, which is a fragmentary sectional view showing the droplet 1E has grown. In case the droplet 1E is liquid, when it grows to the large limit, it falls to the surface 4. In case the droplet 1E is solidified, when it grows, its lower end touches the surface 4, and a touching part 1Ec melts as shown in FIG. 14, which is a fragmentary sectional view of the grown solidified droplet 1E. And subsequently, the droplet 1E is melt as shown in FIGS. 15 and 16, in analogous manner to the afore-mentioned melting process of the Cr-Co material rod 3. FIGS. 15 and 16 are fragmentary sectional views showning the solidified droplet 1E which is being melt in the surface 4 in the order of proceeding time. Thus, almost all part of the droplet 1E is melt in the surface 4. As has been elucidated with respect to the prior art, vapor produced from the surface 4 has a larger Cr content of M than Cr content of Y in the evaporating material 1.

Since the droplet 1E contains larger amount of Cr than the evaporating material 1, the amount of Cr in vicinity of the surface 4 increases, owing to the above-mentioned phenomena. Thus, the amount of Cr in the vapor from the surface 4 increases, and hence the amount of Cr contained in the deposited film 9 increases too. It results in an undesirable change of the Cr/Co proportion of the component in the deposited film 9.

In order to reduce the undesirable change or fluctuation of the proportion of the component, it is preferable to lower the height Hc shown in FIGS. 5 and 12 from the surface 4 to an upper end 2B of the melting pot 2, on the other hand complying the condition that the evaporating material 1 does not over flow the melting pot 2. By so designing, the amount of droplet 1E is reduced.

Further, some droplets similar to the droplet 1E are also observed on a surface 50B (shown in FIG. 5) of the partition 50, and those droplets similarly induce the above-mentioned undesirable change of the Cr/Co proportion of the component of the deposited film 9. Thus it is also preferable that a height Hg (which is a height of the partition 50 from the surface 4 shown in FIG. 5) is lowered to a height similar to the height Hc. With regard to the parts 50Wg, 50Wg of the partition 50 in the vicinity of the side wall 2A of the melting pot 2, a height Hgc is necessarily higher than the height Hg because of mechanical configuration of the partition 50. A length Wg of portions 50Wg, 50Wg is of course short enough in comparison with a length Wa of the whole partition 50, and therefore the portions 50Wg, 50Wg have a little influence on the change of the proportion of the component in the deposited film 9.

Owing to the constitution of the vacuum evaporation apparatus as mentioned above, it becomes possible to supply the evaporating material with stable and constant Cr/Co proportion in the vapor for a long time without fear of making a break in the partition 50. Thereby it is possible to deposit the thin film without protruded foreign matter thereon at high production efficiency.

Figure 17:
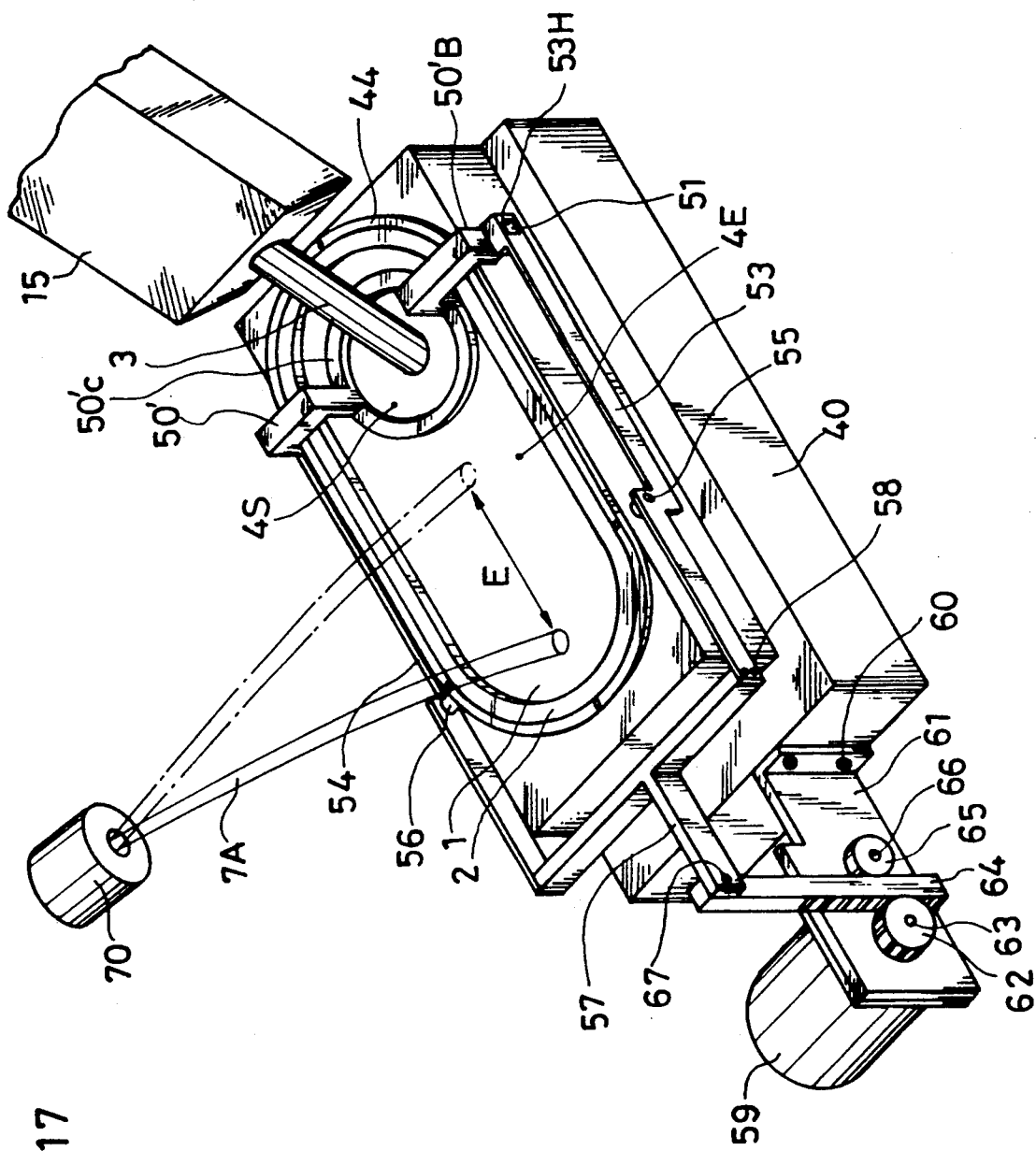
FIG. 17 is a perspective view of a vacuum evaporation apparatus of a second embodiment of the present invention.
Figure 18:
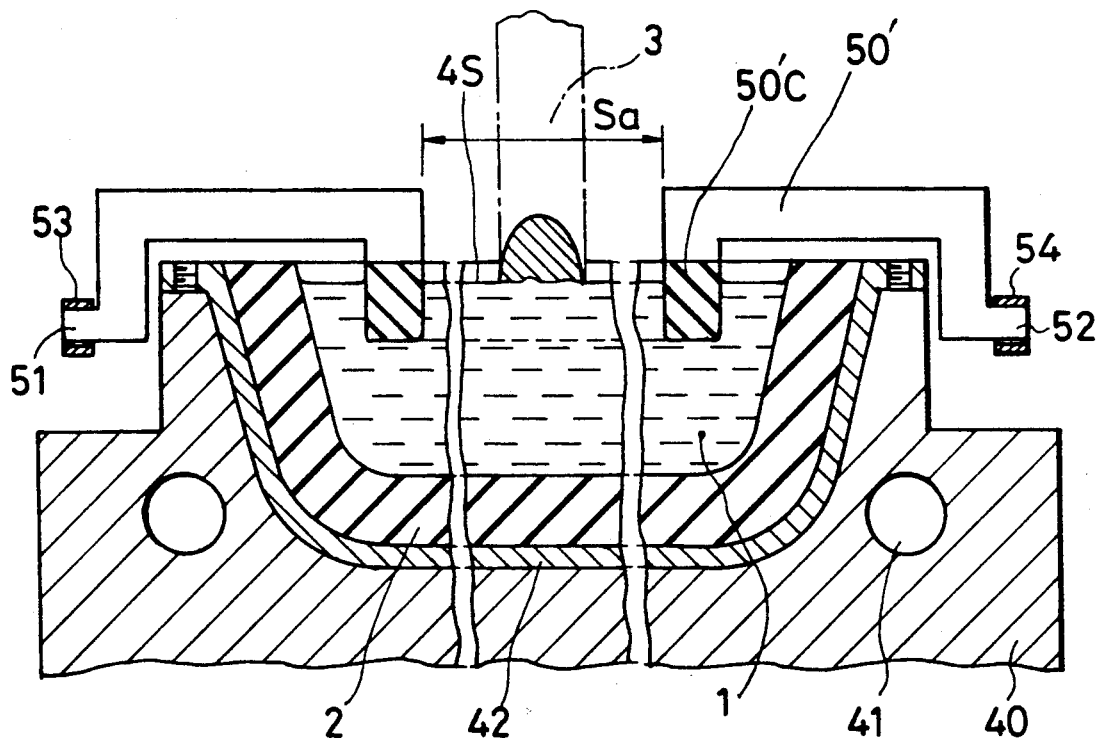
FIG. 18 is a cross sectional view taken on a plane which is defined by a straight side surface 50' B in FIG. 17.

Next, a second embodiment of the present invention is elucidated with reference to the accompanying drawings. FIG. 17 is a perspective view of a vacuum evaporation apparatus of a second embodiment of the present invention. FIG. 18 is a cross sectional view taken on a plane which is defined by a straight side surface 50'B in FIG. 17. Corresponding parts and components to the first embodiment are shown by the same numerals and marks, and the description thereon made in the first embodiment similarly apply. Differences and features of this second embodiment from the first embodiment are as follows.

The partition 50' has a ring shaped part 50'c. In this constitution, the supplying surface 4S is surrounded by the ring shaped part 50'c. Unlike the aforementioned parts 50A, 50A (FIG. 5) of the partition 50 in the first embodiment making the narrow gaps 1D, 1D are no more necessary in the partition 50' in FIG. 17. Therefore, the partition 50' is never caught by the melting pot 2. Thus it becomes easy to lift the partition 50' and to make the partition 50' apart from the surface 4 after deposition.

In the configuration shown in FIG. 17, when the Cr-Co material rod 3 can not melt enough due to low temperature of the supplying surface 4S, the melting is achieved by the aforementioned provision of partial adiabatic condition of the melting pot 2 at the neighborhood of the supplying area Sa.

Figure 19:
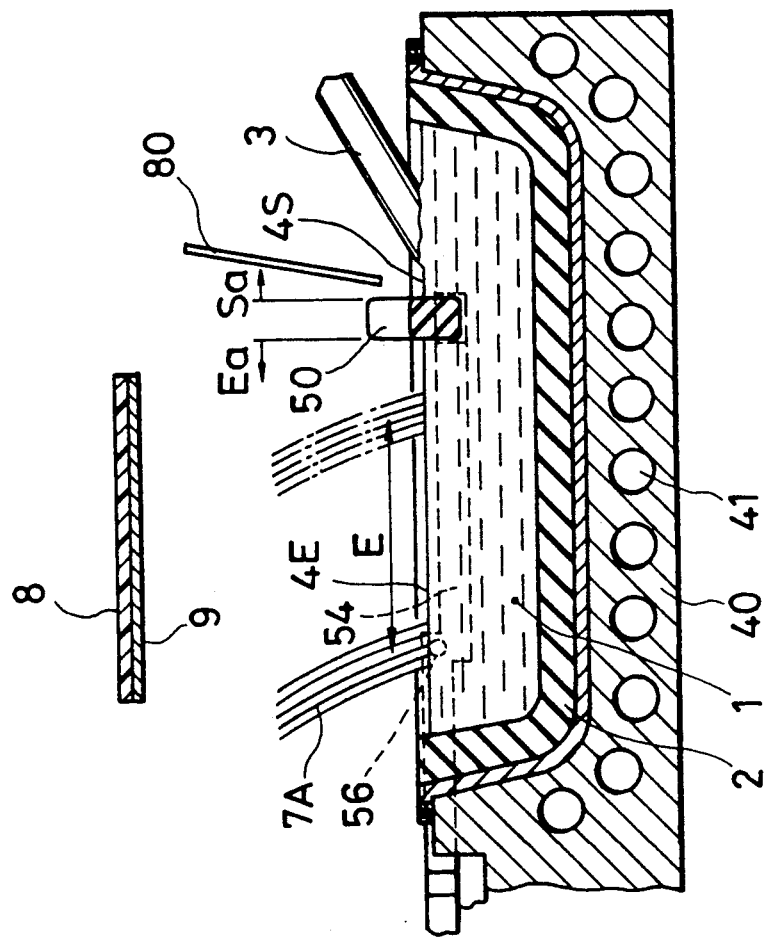
FIG. 19 is a fragmentary sectional side elevation view of a vacuum evaporation apparatus of a third embodiment of the present invention.

A third embodiment of the present invention is elucidated with reference to the accompanying drawings FIG. 19, which is a fragmentary sectional side elevation view of a vacuum evaporation apparatus of a third embodiment of the present invention. Corresponding parts and components to the first embodiment are shown by the same numerals and marks, and the description thereon made in the first embodiment similarly apply. Differences and features of this third embodiment from the first embodiment are as follows.

The temperature of the supplying surface 4S in the supplying area Sa is low because of non-direct irradiation by the electron beam 7A. But there are some vapor from the supplying surface 4S, and the vapor from the supplying area Sa has a high concentration of Cr. Thereby, with regard to the distribution of Cr in the deposited film 9, the concentration of Cr in the right hand of the deposited film 9 tends to be higher than other parts in the above-mentioned embodiments. If the rise of the concentration of Cr is too high and will give a serious problem, a shield 80 should be provided between the supplying area Sa and the substrate 8 as shown in FIG. 19, in order to prevent the vapor from the supplying surface 4S from making deposition on the substrate 8.

Figure 20:
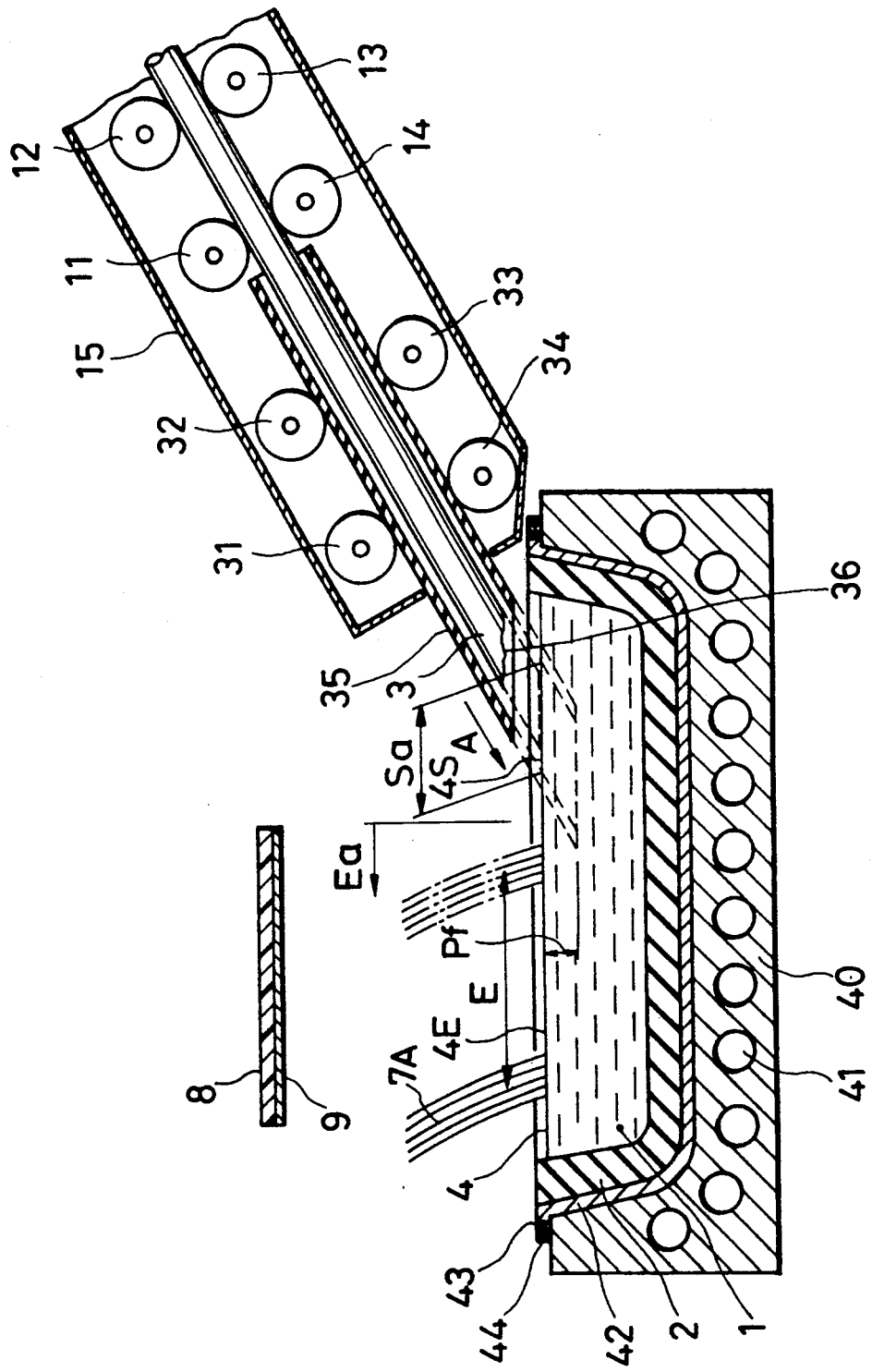
FIG. 20 is a sectional side elevation view of a vacuum evaporation apparatus of a fourth embodiment of the present invention.

A fourth embodiment of the present invention is elucidated with reference to FIG. 20, which is a sectional side elevation view of a vacuum evaporation apparatus of a fourth embodiment of the present invention. Corresponding parts and components to the first embodiment are shown by the same numerals and marks, and the description thereon made in the first embodiment similarly apply. Differences and features of this fourth embodiment from the first embodiment are as follows.

An introduction pipe 35 which contains the Cr-Co material rod 3 therein and introduces it into the surface 4 is disposed. The introduction pipe 35 is of a ceramic e.g. MgO etc. similarly to the partition 50. The introduction pipe 35 is drawn out from the case 15 by rotation of a moving roller 34 and supporting rollers 31, 32 and 33. The moving roller 34 is driven by a motor (not shown in FIG. 20), and the motor for the introduction pipe 35 can be disposed either inside the vacuum chamber (not shown in FIG. 20) or outside the chamber. Thus the introduction pipe 35 moves in a direction shown by an arrow A or in the opposite direction thereto.

Next, the operation of the introduction pipe 35 is elucidated. After ingot-shaped materials are melt as mentioned afore, the introduction pipe 35 is drawn out in the direction shown by the arrow A by rotation of the motor. Therefore, an end tip 36 of the introduction pipe 35 is pre-heated by radiant heat from the surface 4 similarly to the aforementioned pre-heating of the partition 50. As a result of the pre-heating, the introduction pipe 35 is never broken by the thermal shock owing at touching the surface 4.

After insertion of the end tip 36 of the introduction pipe 35 into the surface 4 of the evaporating material 1 up to a predetermined depth Pf, the Cr-Co material rod 3 is drawn out in the same manner as shown in FIG. 2. That is, the part of the surface 4 which is encircled inside the introduction pipe 35 functions similar to the aforementioned supplying suface 4S. And the Cr-Co material rod 3 is supplied onto the supplying surface 4S defined by the introduction pipe 35.

After the finish of the deposition, both the introduction pipe 35 and the Cr-Co material rod 3 are drawn back into the case 15 by rotation of the respective motors for the introduction pipe 35 and for the Cr-Co material rod 3. Therefore, both the end tips 5 and 36 depart from the surface 4 before extinguishment of the electron beam 7A and resultant cooling and solidification of the evaporating material 1 in the pot 2.

Thereby, the intorduction pipe 35 is never broken owing to solidification of the evaporating material 1. The wall of the introduction pipe 35 has the same role as the ring shaped part 50C of the second embodiment (FIG. 17) of the present invention. The wall of the introduction pipe 35 prevents the molten metal 6 of the Cr-Co material rod 3 from direct flowing onto the evaporating surface 4E, and further prevents the undesirable floaters 3A from flowing outside the supplying surface 4S toward the evaporating surface 4E.

Thus it is possible to stop the production of the undersirable splash in the similar manner to the second embodiment of the present invention.

Further, in the embodiment of FIG. 20, since the supplying suface 4S is surrounded by the wall of the introduction tube 35 and the vapor from the supplying surface 4S can not deposited on the substrate 8, the shield 80 as shown in FIG. 19 is not necessary any more.

Figure 21:
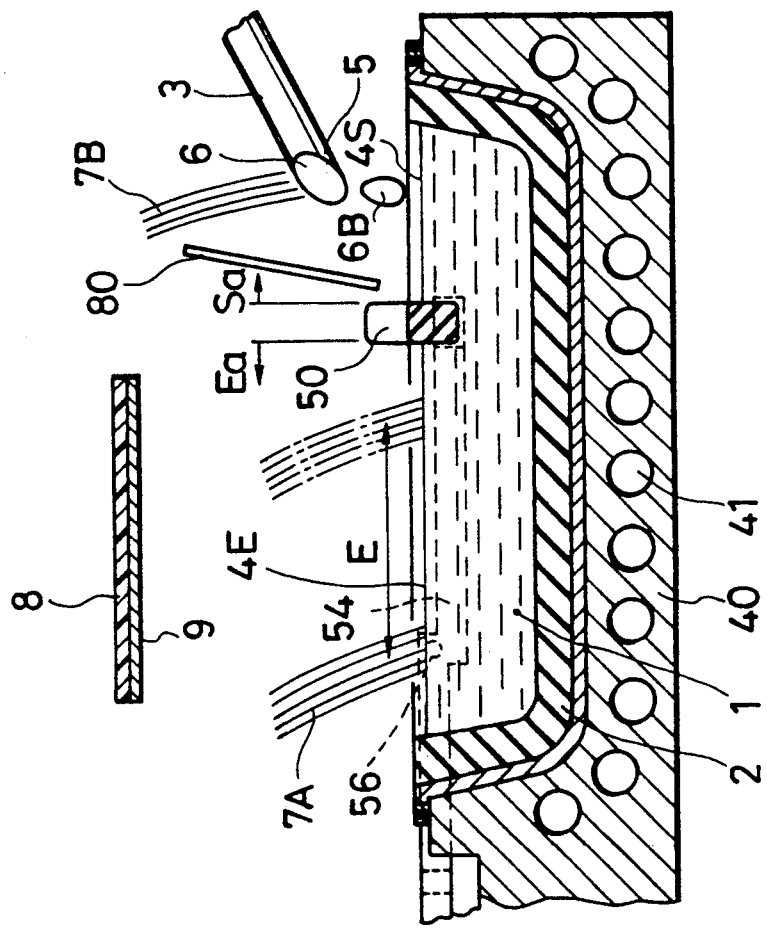
FIG. 21 is a sectional side elevation view of a vacuum evaporation apparatus of a fifth embodiment of the present invention.
Figure 22:
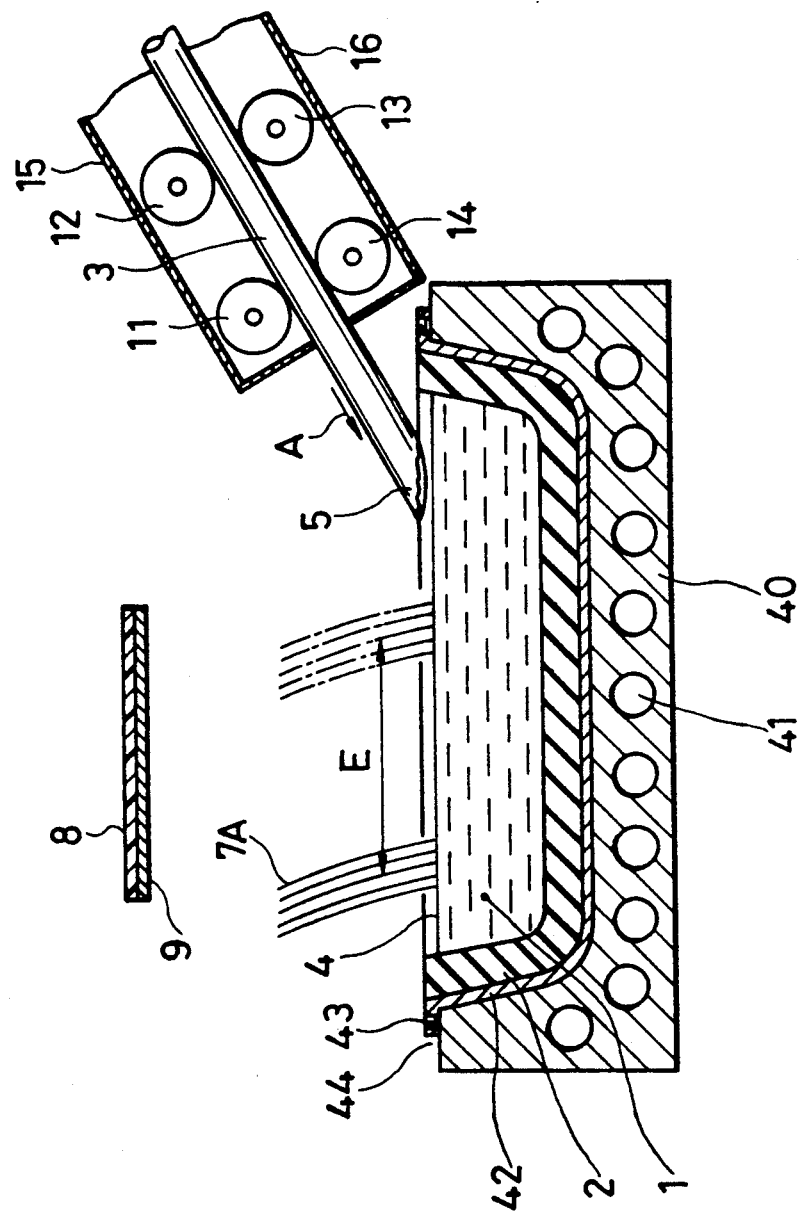
FIG. 22 is a sectional side elevation view of a first conventional vacuum evaporation apparatus.
Figure 23:
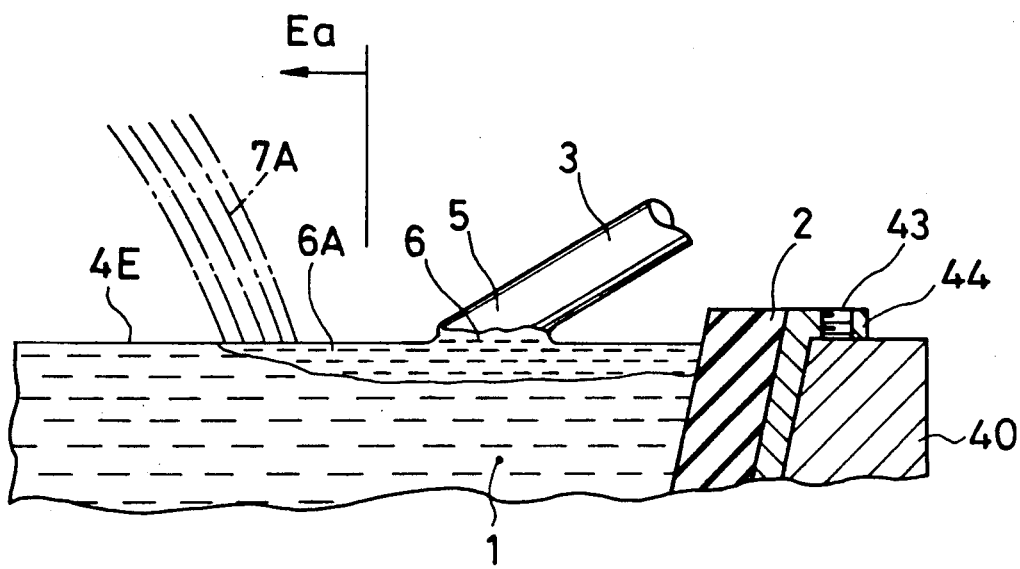
FIG. 23 is an enlarged detail view of the surface 4 shown in FIG. 22.
Figure 24:
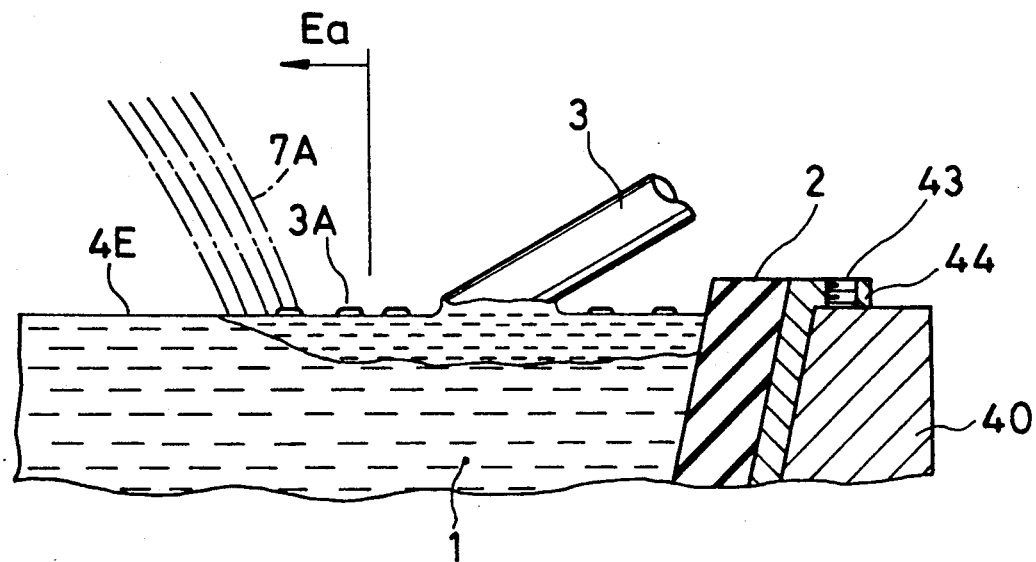
FIG. 24 is an enlarged detail view of the surface 4 of the evaporating material whereon floaters 3A are shown.
Figure 25:
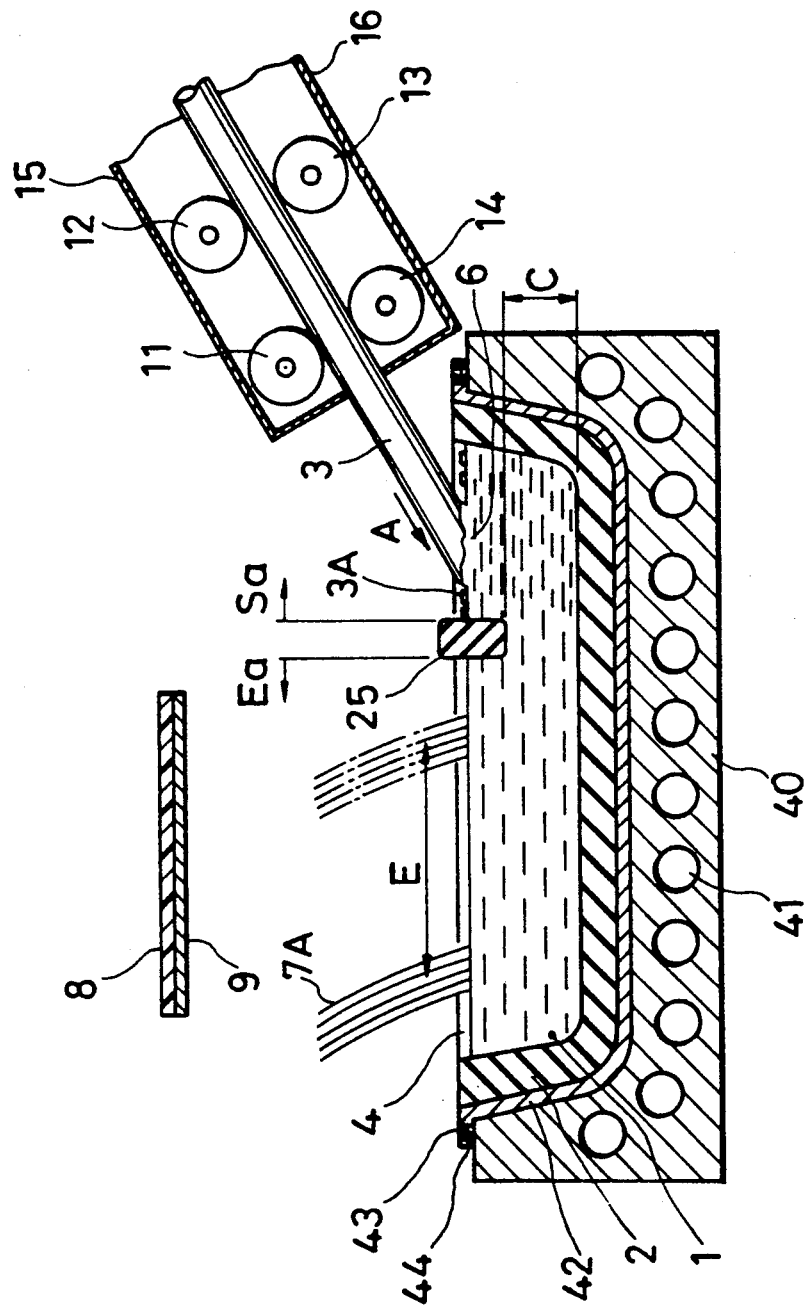
FIG. 25 is a sectional side elevation view of the second conventional vacuum evaporation apparatus.

A fifth embodiment of the present invention is elucidated with reference to FIG. 21, which is a sectional side elevation view of a vaccum evaporation apparatus of a fifth embodiment of the present invention. Corresponding parts and component to the first embodiment are shown by the same numerals and marks, and the description thereon made in the first embodiment similarly apply. Differences and features of this fifth embodiment from the first embodiment are as follows.

This embodiment is devised not to break the partition 50 by un-melted end tip of the Cr-Co material rod even when the temperature of the supplying surface 4S of the supplying area Sa is not high enough for melting the end tip of the Cr-Co material rod 3. In this embodiment of FIG. 21, the end tip 5 of the Cr-Co material rod 3 disposed apart up from the supplying surface 4S is irradiated by an electron beam 7B. Therefore, the material of the end tip 5 is melt into drops 6B and falls into the surface 4S. Thereby, even a Cr-Co material rod 3 of the the evaporating material of high melting point is usable.

Although the elucidation has been made as to the replenishing material shaped like a Cr-Co material rod, the present invention is applicable to the replenishing material shaped like a wire, grains or the like.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A vacuum evaporation apparatus comprising;
   a melting pot for containing evaporating material therein,
   an electron gun which irradiates an electron beam onto said evaporating material,
   a replenishing material which is supplied into a surface of said evaporating material by a supplying means for replenishing said evaporating material, and
   a movable partition which is moved by a moving means in a manner that said partition has a first position wherein said partition separates said surface into a supplying surface and an evaporating surface and a second position wherein said partition is removed apart from said surface.

2. A vacuum evaporation apparatus in accordance with claim 1 wherein;
   said supplying surface is surrounded by a side wall of said melting pot and the partition.

3. A vacuum evaporation apparatus in accordance with claim 1 wherein;
   said supplying surface is surrounded by a ring shaped part of said partition.

4. A vacuum evaporation apparatus in accordance with claim 1 wherein;
   said supplying surface is surrounded by a pipe shaped partition.

5. A vacuum evaporation apparatus in accordance with claim 1, 2 or 3 wherein;
   a height of substantial part of said partition from said surface is as low as a height of said side wall from said surface.
6. A vacuum evaporation apparatus in accordance with claim 1, 2, 3 or 4 wherein;
   said moving means moves said partition onto said surface 4 at a slower speed enough for pre-heating it, and after touching said surface, said partition is moved at a faster speed.
7. A vacuum evaporation apparatus in accordance with claim 1, 2, 3 or 4 wherein;
   a gap between said partition 50 and said melting pot is determined in a manner that a supplying speed of said replenishing material is almost the same as a melting speed to said surface of said replenishing material.
8. A vacuum evaporation apparatus in accordance with claim 1 or 2 wherein;
   said electron gun further irradiates an electron beam onto areas of said surface in the neighborhood of parts of said partition which are loosely coupled respectively with parts of said melting pot.
9. A vacuum evaporation apparatus in accordance with claim 1 wherein;
   said melting pot has adiabatic means at least at the neighborhood of said supplying surface 4S.

* * * * *